(12) United States Patent
Tai et al.

(10) Patent No.: US 9,343,499 B1
(45) Date of Patent: May 17, 2016

(54) INTEGRATED CIRCUIT STACK WITH STRENGTHENED WAFER BONDING

(71) Applicant: OMNIVISION TECHNOLOGIES, INC., Santa Clara, CA (US)

(72) Inventors: Hsin-Neng Tai, San Jose, CA (US); Hung-Ming Weng, San Jose, CA (US); Michael Chen, San Jose, CA (US); Chih-Huei Wu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/694,813

(22) Filed: Apr. 23, 2015

(51) Int. Cl.
*H01L 27/146* (2006.01)
(52) U.S. Cl.
CPC .... *H01L 27/14636* (2013.01); *H01L 27/14632* (2013.01); *H01L 27/14634* (2013.01); *H01L 27/14643* (2013.01)
(58) Field of Classification Search
CPC ............... H01L 21/02216; H01L 21/02222; H01L 21/2007; H01L 23/49513; H01L 24/02
USPC .................... 257/448, 459, E23.02
See application file for complete search history.

(56) References Cited

U.S. PATENT DOCUMENTS 6,500,694 B1    12/2002   Enquist

OTHER PUBLICATIONS

Mackenzie, K. D. et al., "Inductively-Coupled Plasma Depositon of Low Temperature Silicon Dioxide and Silicon Nitride Films for III-V Applications," Invited paper presented at 195th Electrochemical Society Meeting, Seattle WA, May 1999, Proc. Symp. 30th State-of-the-Art Program on Compound Semiconductors, 99-4, pp. 1-12, Electrochemical Society, Pennington, NJ (1999).
Warner, K. et al., "Low-Temperature Oxide-Bonded Three-Dimensional Integrated Circuits," 2002 IEEE International SOI Conference, Oct. 2002, pp. 123-125.

*Primary Examiner* — Tan N Tran
(74) *Attorney, Agent, or Firm* — Blakely Sokoloff Taylor & Zafman LLP

(57) ABSTRACT

An integrated circuit system includes a first device and second device wafer. A wafer bonding region is disposed at an interface of a front side of a first dielectric layer of the first device wafer and a front side of a second dielectric layer of the second device wafer such that wafer bonding region bonds the first device wafer to the second device wafer. The wafer bonding region includes dielectric material having a higher silicon concentration than a dielectric material of the first and second dielectric layers of the first and second device wafers. A conductive path couples a first conductor of the first device wafer to a second conductor of the second device wafer. The conductive path is formed in a cavity etched through the wafer bonding region between the first conductor and the second conductor.

20 Claims, 3 Drawing Sheets

INTEGRATED CIRCUIT STACK WITH STRENGTHENED WAFER BONDING

BACKGROUND INFORMATION

1. Field of the Disclosure

The present invention relates generally semiconductor processing. More specifically, examples of the present invention are related to semiconductor processing of stacked integrated circuit systems.

2. Background

As integrated circuit technologies continue to advance, there are continuing efforts to increase performance and density, improve form factor, and reduce costs. The implementation of stacked three dimensional integrated circuits have been one approach that designers sometimes use to realize these benefits. The advances in wafer bonding with very precise alignments make it possible to fabricate stacked chips on wafer-level. The possible applications could include logic chips that are bonded to memory chips, image sensor chips, among others. This offers the advantage of smaller form factors, improved performance, and lower costs.

A key challenge when implementing stacked three dimensional integrated circuit systems, which continue to get smaller and faster, relates to weak bonding interfaces between the stacked wafers. In particular, weak bonding interfaces in stacked three dimensional integrated circuits suffer from cracks and peeling as a result of the etching processes. As a consequence, etching through weak bonding interfaces of stacked integrated circuit chips may cause unreliable connections between the wafers, and therefore failures in the stacked integrated circuit systems.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Figure 1A:
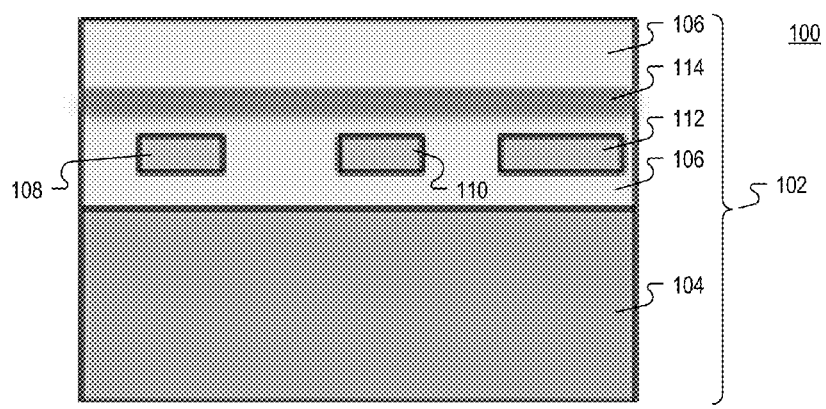
FIGS. 1A-1F illustrate example cross-section diagrams that show an example of a stacked three dimensional integrated circuit including stacked first and second device wafers that are bonded together with strengthened wafer bonding in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to strengthening the wafer bonding between stacked first and second wafers in a stacked three dimensional integrated circuit system are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

As will be shown, examples of a stacked three dimensional integrated circuit system with strengthened wafer bonding are described, which can be utilized for example to implement an imaging system in accordance with the teachings of the present invention. In one example, a pixel array of an imaging system may be included in a first device wafer that is stacked and bonded to a second device wafer, which may include pixel support circuitry that is coupled to the pixel array through a strengthened wafer bonding region in accordance with the teachings of the present invention. In one example, the strengthened wafer bonding region is disposed between the first and second device wafers to bond the first device wafer to the second device wafer. In the example, the wafer bonding region includes dielectric material having a higher silicon concentration than the adjoining dielectric material of the dielectric layers of the first and second device wafers. In one example, the deposition conditions are changed during the deposition of the wafer bonding region to create a varied composition layer region having the higher silicon concentration. The higher silicon concentration strengthens the wafer bonding region and reduces the etch rate of cavities that etched through the wafer bonding region. As a result, lateral etching in the wafer bonding region is substantially reduced or eliminated such that the etching profiles of the cavities that are etched through the wafer bonding region are substantially vertical. The substantially vertical etching profiles of the cavities through the wafer bonding region increases yields of stacked three dimensional integrated circuit systems by reducing reliability failures. The substantially vertical cavities through the wafer bonding region may then be filled with conductive materials to provide reliable conductive paths, such as through silicon vias (TSVs) or the like, in accordance with the teachings of the present invention.

To illustrate, FIG. 1A is an example cross-section diagram that shows an example first device wafer 102 of an integrated circuit system 100 including a first semiconductor layer 104 proximate to a first metal layer including conductors 108, 110, and 112, disposed within a first dielectric layer 106 in accordance with the teachings of the present invention. In one example, the first dielectric layer 106 may include oxide film types, such as for example but not limited to silicon dioxide, silicon nitride, PETEOS, FTEOS, PEOX, HDP oxide, or the like. The example depicted in FIG. 1A also illustrates a wafer bonding region 114 inserted in first dielectric layer 106 in accordance with the teachings of the present invention. In one example, wafer bonding region 114 also includes a dielectric material, such as for example one of silicon dioxide, silicon nitride, or the like, but with a higher silicon concentration than the dielectric material of first dielectric layer 106 outside of the wafer bonding region 114. For instance, in a silicon dioxide example, the silicon dioxide of wafer bonding region 114 may be inserted in-situ during a continuous deposition process of the first dielectric layer 106 to provide the higher silicon concentration in wafer bonding region 114 within first dielectric layer 106 compared to the silicon concentration of first dielectric layer 106 in accordance with the teachings of the present invention. In one example, the silicon to oxygen ratio in wafer bonding region 114 may be 5:1. In one example, the thickness of wafer bonding region 114 may be in the range of 30~100 nm. As will be discussed, the higher concentration of wafer bonding region 114 provides increased strength and has a slower etch rate, which provides a substantially completely vertical etching profile to improve reliability and reduce failures in accordance with the teachings of the present invention.

Figure 1B:
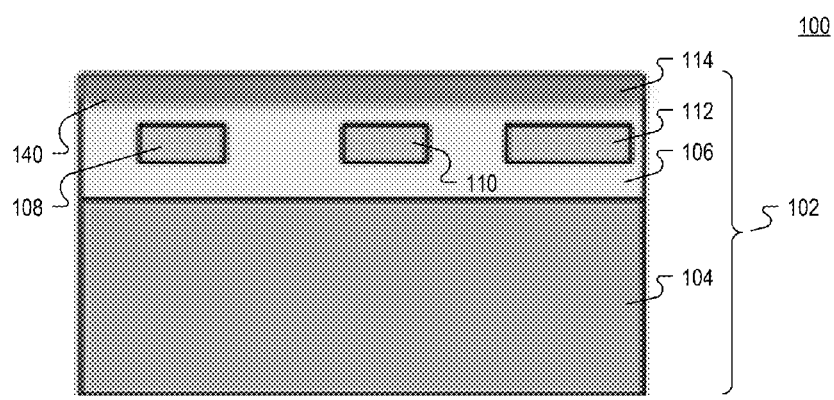

FIG. 1B is an example cross-section diagram of integrated circuit system 100 that shows example first device wafer 102 after the first dielectric layer 106 is thinned from the front side 140 to wafer bonding region 114. In one example, chemical mechanical planarization/polishing (CMP) may be performed on the front side 140 of first dielectric layer 106 and then stopped when the first dielectric layer 106 is thinned down to the wafer bonding region 114 as shown in accordance with the teachings of the present invention.

Figure 1C:
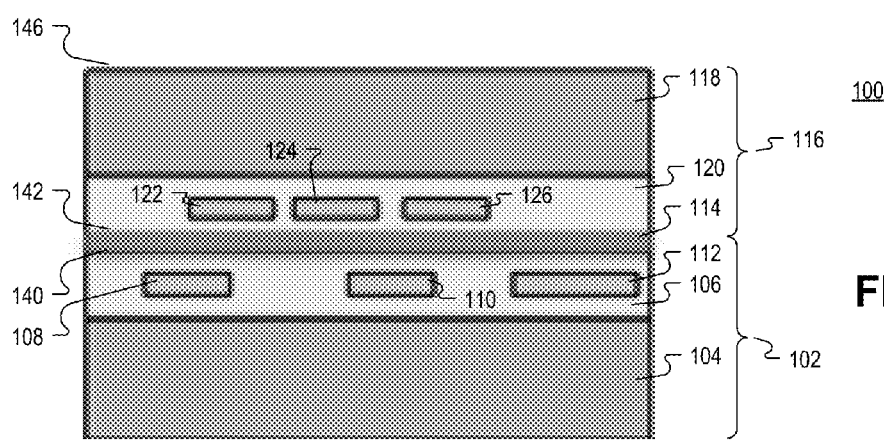

FIG. 1C shows an example cross-section diagram of integrated circuit system 100 that illustrates a second device wafer 116 that is stacked and bonded with first device wafer 102 with wafer fusion bonding at the wafer bonding region 114 in accordance with the teachings of the present invention. In the example, wafer bonding region 114 is at the interface of the front side 140 of first dielectric layer 106 and a front side 142 of a second dielectric layer 120 of second device wafer 116. In one example, the higher concentration of silicon in the wafer bonding region 114 compared to the silicon concentration in the first and second dielectric layers 106 and 120 provides a bonding strength of 1.5~2.5 J/m$^2$.

As shown in the depicted example, second device wafer 116 also includes a second semiconductor layer 118 that is proximate to a second metal layer including conductors 122, 124, 126, which are disposed within the second dielectric layer 118. As will be discussed in greater detail below, in one example, a pixel array of an image sensing system may be included in the second device wafer 116. In one example, the pixel array may be illuminated through a back side 146 of the second semiconductor layer 118. In the example, pixel support circuitry may be included in the first device wafer 102 to support the pixel array included in the first device wafer 116.

Figure 1D:
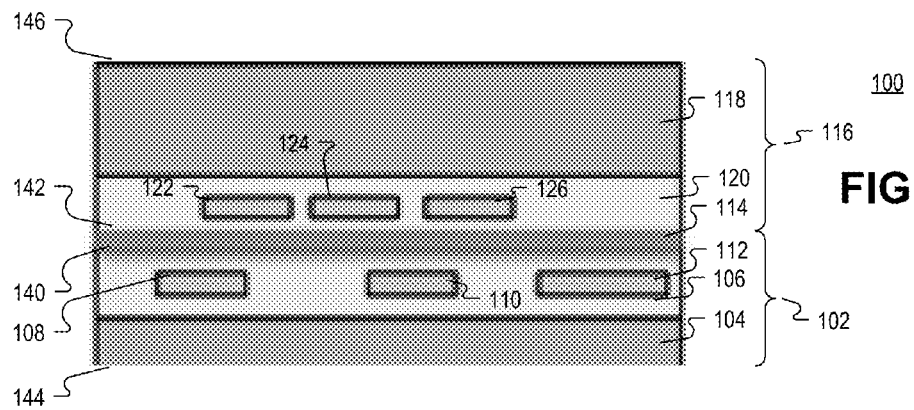

FIG. 1D is an example cross-section diagram of integrated circuit system 100 that shows example first device wafer 102 and second device wafer 116 after the first semiconductor layer 104 is thinned from the backside 144 of first semiconductor layer 104. In one example, chemical mechanical planarization/polishing (CMP) may be performed on the backside 144 of first semiconductor layer 104 to thin the first semiconductor layer 104.

Figure 1E:
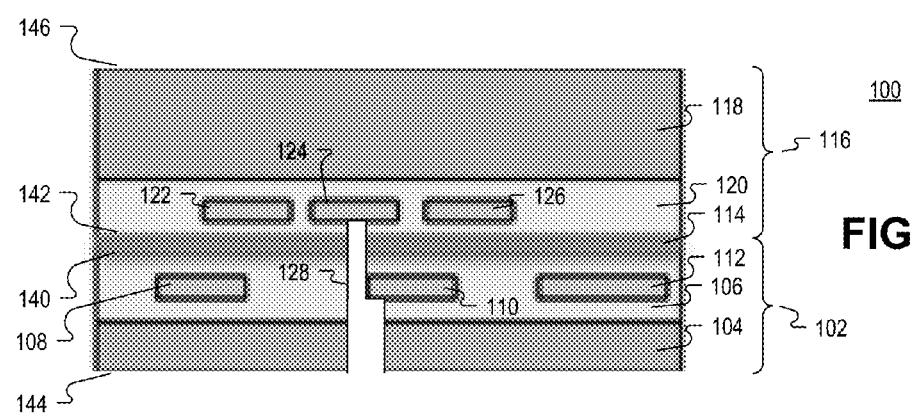

FIG. 1E is an example cross-section diagram of integrated circuit system 100 that shows example first device wafer 102 and second device wafer 116 after a cavity 128 has been etched from the backside 144 through wafer bonding region 114 between conductor 110 in first dielectric layer 106 and conductor 124 in second dielectric layer 120. In one example, the etch rate through the dielectric material of wafer bonding region 114 is less than the etch rate through the dielectric material of first and second dielectric regions 106 and 120 in accordance with the teachings of the present invention. As a result of the strengthened dielectric material and slower etch rate of wafer bonding region 114, it is appreciated that the etching profile of cavity 128 has a substantially vertical etching profile. In other words, it is appreciated that the cavity 128 etched through the wafer bonding region 114 is substantially absent of lateral etching, which can cause an unwanted non-vertical etching profile. As a result, it is appreciated that the bonding interface provided with wafer bonding region 114 is substantially free of cracks and other defects resulting from the etching process, which improves reliability and reduces failures in accordance with the teachings of the present invention. Indeed, it is appreciated that the wafer bonding provided with wafer bonding region 114 provides high density Si—OH for van der Waals bonding that strengthens bonding strength in accordance with the teachings of the present invention.

Figure 1F:
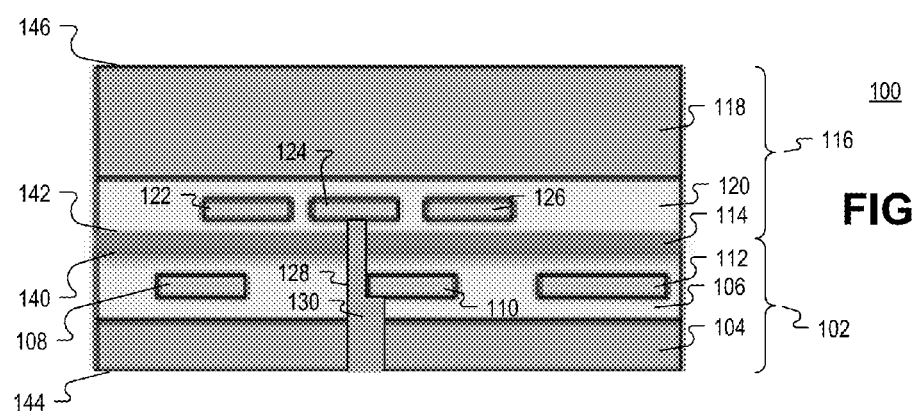

FIG. 1F is an example cross-section diagram of integrated circuit system 100 that shows example first device wafer 102 and second device wafer 116 after the cavity 128 is etched from the backside 144 and then with conductive material 130 to provide for example a through silicon via (TSV) to couple together conductor 110 in first device wafer 102 and conductor 124 in second device wafer 116 in accordance with the teachings of the present invention. In one example, conductive material 130 may include for example a metal such as copper, aluminum, or another suitable conductive material to electrically connect first device wafer 102 to second device wafer 116. Although not shown in FIG. 1F, in one example, it is appreciated that the cavity 128 may also include an insulating layer disposed between the conductive material 130 and the semiconductor material of first semiconductor layer 104 to prevent an unwanted short circuit connection between conductive material 130 and first semiconductor layer 104. It is appreciated that with the strengthened wafer bonding region 114 that the bonding at the interface of first and second device wafers 102 and 116 is substantially free of cracks and other defects caused by the etching process, and that the electrical connections between first device wafer 102 and second device wafer 116 therefore have increased strength and reliability in accordance with the teachings of the present invention.

Figure 2:
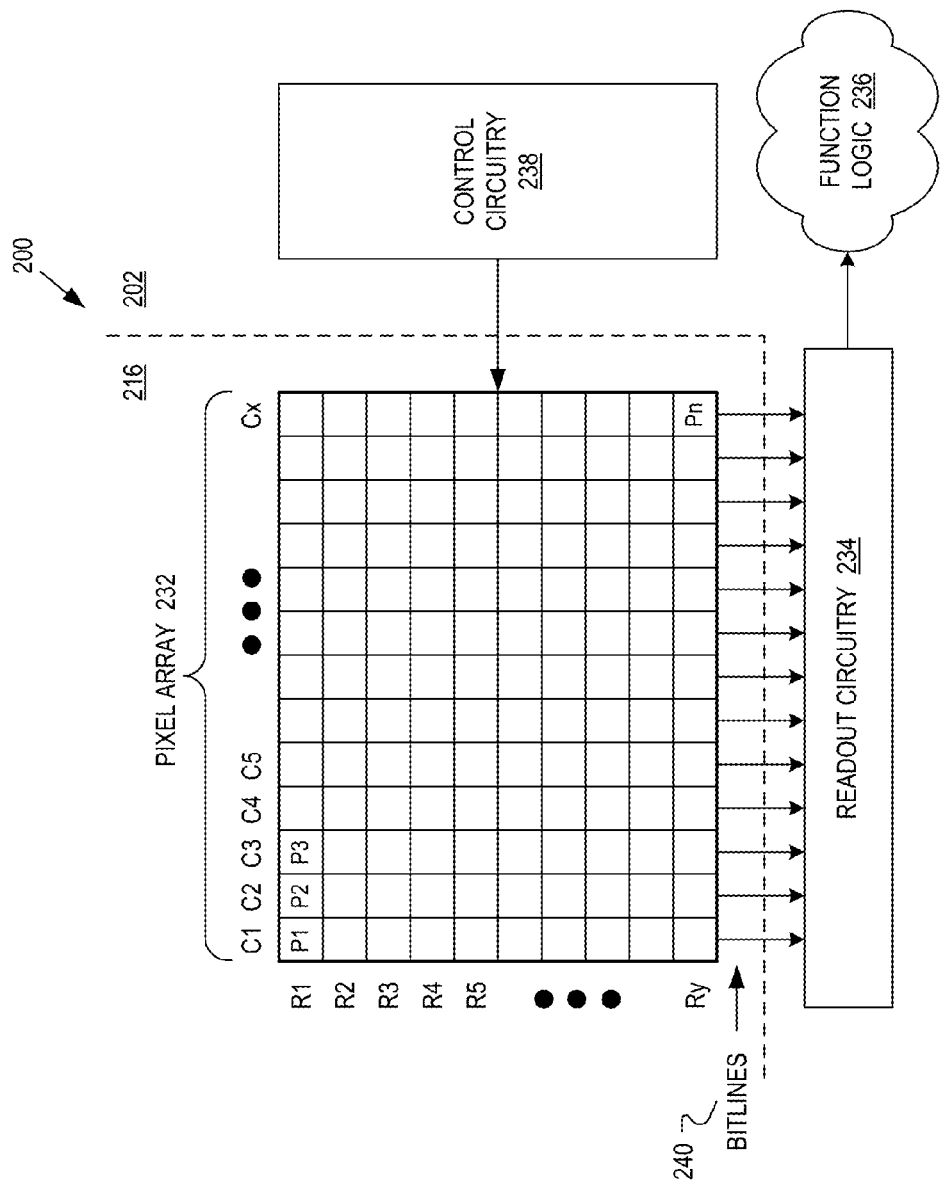
FIG. 2 is a diagram illustrating one example of an imaging system including a pixel array having image sensor pixels included in a stacked three dimensional integrated circuit system having strengthened wafer bonding in accordance with the teachings of the present invention.

FIG. 2 is a diagram illustrating one example of an imaging system 200 including an example pixel array 232 having a plurality of image sensor pixels included in an example stacked three dimensional integrated circuit having stacked first and second device wafers 202 and 216 that are bonded together with strengthened wafer bonding in accordance with the teachings of the present invention. As shown in the depicted example, imaging system 200 includes pixel array 232 coupled to control circuitry 238 and readout circuitry 234, which is coupled to function logic 236. In the illustrated example, the first device wafer 202 includes pixel support circuitry such as readout circuitry 234, function logic 236, and control circuitry 238, and the second device wafer 216 includes pixel array 232.

In one example, pixel array 232 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc.

In one example, after each pixel has acquired its image data or image charge, the image data is readout through bitlines 240 by readout circuitry 234 and then transferred to function logic 236. In one example, the connections between first and second device wafers 202 and 216 through bitlines 240 are provided through conductors and conductive materials through a strengthened wafer bonding region, such as for example as illustrated and described in FIGS. 1A-1F above. In various examples, readout circuitry 234 may include amplification circuitry, analog-to-digital (ADC) conversion circuitry, or otherwise. Function logic 236 may simply store the image data or even manipulate the image data by applying post image effects (e.g., crop, rotate, remove red eye, adjust brightness, adjust contrast, or otherwise). In one example, readout circuitry 234 may readout a row of image data at a time along readout column lines (illustrated) or may readout the image data using a variety of other techniques (not illustrated), such as a serial readout or a full parallel readout of all pixels simultaneously.

In one example, control circuitry 238 is coupled to pixel array 232 to control operational characteristics of pixel array 232. In one example, the connections between control circuitry 238 and pixel array 232 may also be provided through conductors and conductive materials through a strengthened wafer bonding region, such as for example as illustrated and described in FIGS. 1A-1F above. In one example, control circuitry 238 may generate a shutter signal for controlling image acquisition. In one example, the shutter signal is a global shutter signal for simultaneously enabling all pixels within pixel array 232 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An integrated circuit system, comprising:
    a first device wafer having a first semiconductor layer proximate to a first metal layer including a first conductor disposed within a first dielectric layer;
    a second device wafer having a second semiconductor layer proximate to a second metal layer including a second conductor disposed within a second dielectric layer;
    a wafer bonding region disposed at an interface of a front side of the first dielectric layer of the first device wafer and a front side of the second dielectric layer of the second device wafer such that wafer bonding region bonds the first device wafer to the second device wafer, wherein the wafer bonding region includes dielectric material having a higher silicon concentration than a dielectric material of the first and second dielectric layers of the first and second device wafers; and
    a conductive path coupling the first conductor to the second conductor, wherein the conductive path is formed in a cavity etched through the wafer bonding region between the first conductor and the second conductor.

2. The integrated circuit system of claim 1 wherein an etching profile of the cavity etched through the wafer bonding region is completely vertical, such that a non-vertical etching profile is absent from the cavity etched through the wafer bonding region.

3. The integrated circuit system of claim 1 wherein the higher silicon concentration of the dielectric material of the wafer bonding region causes an etch rate that is less than an etch rate through the dielectric material of the first and second dielectric layers of the first and second device wafers.

4. The integrated circuit system of claim 1 wherein the cavity etched through the wafer bonding region is etched through the second semiconductor layer from a backside of the second device wafer.

5. The integrated circuit system of claim 1 wherein the conductive path formed in the cavity etched through the wafer bonding region is filled with conductive material coupled to the first conductor to the second conductor.

6. The integrated circuit system of claim 1 wherein the wafer bonding region and the first and second dielectric layers comprise one of silicon dioxide or silicon nitride.

7. The integrated circuit system of claim 1 wherein the wafer bonding region and the first and second dielectric layers comprise silicon dioxide, wherein the silicon dioxide of the wafer bonding region has the higher silicon concentration than a silicon dioxide of the first and second dielectric layers of the first and second device wafers.

8. The integrated circuit system of claim 7 wherein a silicon to oxygen ratio in the wafer bonding region is 5:1.

9. The integrated circuit system of claim 1 wherein the wafer bonding region comprises an in-situ deposition of the dielectric material having the higher silicon concentration during an oxide deposition.

10. The integrated circuit system of claim 1 wherein one of the first device wafer and second device wafer comprises an imager chip and an other one of the first device wafer and second device wafer comprises a processing chip.

11. An imaging system, comprising:
    a pixel array having a plurality of image sensor pixels, wherein the pixel array is included in an integrated circuit system including:
        a first device wafer having a first semiconductor layer proximate to a first metal layer including a first conductor disposed within a first dielectric layer;
        a second device wafer having a second semiconductor layer proximate to a second metal layer including a second conductor disposed within a second dielectric layer;
        a wafer bonding region disposed at an interface of a front side of the first dielectric layer of the first device wafer and a front side of the second dielectric layer of the second device wafer such that wafer bonding region bonds the first device wafer to the second device wafer, wherein the wafer bonding region includes dielectric material having a higher silicon concentration than a dielectric material of the first and second dielectric layers of the first and second device wafers; and a conductive path coupling the first conductor to the second conductor, wherein the conductive path is formed in a cavity etched through the wafer bonding region between the first conductor and the second conductor;

control circuitry coupled to the pixel array to control operation of the pixel array; and readout circuitry coupled to the pixel array to readout image data from the plurality of image sensor pixels.

12. The imaging system of claim 11 wherein an etching profile of the cavity etched through the wafer bonding region is completely vertical, such that a non-vertical etching profile is absent from the cavity etched through the wafer bonding region.

13. The imaging system of claim 11 wherein the higher silicon concentration of the dielectric material of the wafer bonding region causes an etch rate that is less than an etch rate through the dielectric material of the first and second dielectric layers of the first and second device wafers.

14. The imaging system of claim 11 wherein the cavity etched through the wafer bonding region is etched through the second semiconductor layer from a backside of the second device wafer.

15. The imaging system of claim 11 wherein the conductive path formed in the cavity etched through the wafer bonding region is filled with conductive material coupled to the first conductor to the second conductor.

16. The imaging system of claim 11 wherein the wafer bonding region and the first and second dielectric layers comprise one of silicon dioxide or silicon nitride.

17. The imaging system of claim 16 wherein a silicon to oxygen ratio in the wafer bonding region is 5:1.

18. The imaging system of claim 11 wherein the wafer bonding region and the first and second dielectric layers comprise silicon dioxide, wherein the silicon dioxide of the wafer bonding region has the higher silicon concentration than a silicon dioxide of the first and second dielectric layers of the first and second device wafers.

19. The imaging system of claim 11 wherein the wafer bonding region comprises an in-situ deposition of the dielectric material having the higher silicon concentration during an oxide deposition.

20. The imaging system of claim 11 wherein one of the first device wafer and second device wafer includes the pixel array and an other one of the first device wafer and second device wafer includes the control circuitry and the readout circuitry.

* * * * *